US009312782B2

(12) United States Patent
Tachibana

(10) Patent No.: US 9,312,782 B2
(45) Date of Patent: Apr. 12, 2016

(54) POWER CONVERTER EQUIPPED WITH SEMICONDUCTOR MODULE

(75) Inventor: Hideaki Tachibana, Anjo (JP)

(73) Assignee: DENSO CORPORATION, Kariya (JP)

( * ) Notice: Subject to any disclaimer, the term of this patent is extended or adjusted under 35 U.S.C. 154(b) by 232 days.

(21) Appl. No.: 13/600,465

(22) Filed: Aug. 31, 2012

(65) Prior Publication Data

US 2013/0058143 A1 Mar. 7, 2013

(30) Foreign Application Priority Data

Sep. 2, 2011 (JP) ................................. 2011-191560

(51) Int. Cl.
*H02M 7/537* (2006.01)
*H02M 7/00* (2006.01)
*H02M 7/797* (2006.01)

(52) U.S. Cl.
CPC .............. *H02M 7/003* (2013.01); *H02M 7/797* (2013.01)

(58) Field of Classification Search
CPC ........... G05F 1/573; G05F 1/575; G06F 1/20; H02M 1/44; H02M 7/003; H02G 5/10; H02G 5/066; H02G 5/06
USPC ............... 323/277; 363/21.17; 174/16.2, 251, 174/72 B, 261, 262; 361/648, 679.36, 751, 361/775
See application file for complete search history.

(56) References Cited

U.S. PATENT DOCUMENTS

| 5,589,743 A * | 12/1996 | King ............................. 318/139 |
| 5,623,399 A * | 4/1997 | Ishii et al. ..................... 363/132 |
| 5,762,521 A * | 6/1998 | Tanaka et al. ................. 439/492 |
| 5,831,425 A * | 11/1998 | Ochiai ....................... 324/117 R |
| 7,028,568 B2 * | 4/2006 | Tokunaga et al. ............ 73/866.5 |
| 7,357,649 B2 * | 4/2008 | Asao ............................ 439/76.2 |
| 7,508,668 B2 * | 3/2009 | Harada et al. ................. 361/699 |
| 7,722,372 B2 * | 5/2010 | Matsumoto et al. .......... 439/213 |
| 7,724,523 B2 * | 5/2010 | Ishiyama ...................... 361/699 |

(Continued)

FOREIGN PATENT DOCUMENTS

| CN | 1897380 | 1/2007 |
| JP | 09-069603 | 3/1997 |

(Continued)

OTHER PUBLICATIONS

Office Action (10 pages) dated Jun. 18, 2014, issued in corresponding Chinese Application No. 201210320747.6 with English translation (14 pages).

*Primary Examiner* — William H Mayo, III
*Assistant Examiner* — Hiram E Gonzalez
(74) *Attorney, Agent, or Firm* — Nixon & Vanderhye P.C.

(57) ABSTRACT

In a power converter, a plurality of AC busbars are electrically connected to an AC load. An insulating support surrounds at least part of a stacked converter unit of semiconductor modules and refrigerant paths. The set of busbars are fixedly mounted on the insulating support. A terminal holder has a mount surface on which one end of each of the plurality of AC busbars is mounted as a terminal. A current sensor has a through-hole and measures a current flowing through at least part of at least one of the plurality of AC busbars. The current sensor is attached to the terminal holder with the at least part of the at least one of the plurality of AC busbars being fitted in the through-hole of the current sensor.

8 Claims, 13 Drawing Sheets

(56) References Cited

U.S. PATENT DOCUMENTS

| | | | |
|---|---|---|---|
| 9,007,767 B2 * | 4/2015 | Nakajima | 361/699 |
| 2002/0113302 A1 * | 8/2002 | Shinohara | 257/678 |
| 2007/0015384 A1 | 1/2007 | Asao | |
| 2009/0294195 A1 * | 12/2009 | Otsuka et al. | 180/65.275 |
| 2011/0261600 A1 | 10/2011 | Tachibana | |

FOREIGN PATENT DOCUMENTS

| | | |
|---|---|---|
| JP | 11-121067 | 4/1999 |
| JP | 2007-166803 | 6/2007 |
| JP | P2010-115061 A | 5/2010 |
| JP | 2011-125083 | 6/2011 |
| JP | P2011-172469 A | 9/2011 |

* cited by examiner

POWER CONVERTER EQUIPPED WITH SEMICONDUCTOR MODULE

CROSS REFERENCE TO RELATED APPLICATIONS

This application is based on and claims the benefit of priority from Japanese Patent Application 2011-191560 filed on Sep. 2, 2011, the disclosure of which is incorporated in its entirety by reference.

TECHNICAL FIELD

The present disclosure relates to power converters equipped with: semiconductor modules, each of which has a plurality of power terminals and incorporates therein at least one semiconductor element; and a plurality of busbars connected to the plurality of power terminals of each semiconductor module.

BACKGROUND

As one type of power converters for AC-DC power conversion, there have been known power converters equipped with a plurality of semiconductor modules each incorporating therein at least one semiconductor element, one example of which is disclosed in Japanese Patent Application Publication No. 2010-115061.

Another example of the power converters of the one type is disclosed in US Patent Application Publication No. 2011/0261600 corresponding to Japanese Patent Application Publication No. 2011-172469.

SUMMARY

If these known power converters for AC-DC power conversion are used to drive AC loads, such as AC motors, a current sensor for measurement of alternating currents to the corresponding AC electrical loads as output currents is needed. In view of easy fabrication of such a power converter, there is a need for easy attachment of such a current sensor to a power converter.

In view of the circumstances set forth above, one aspect of the present disclosure seeks to provide power converters, each of which is equipped with a current sensor for measurement of alternating currents to an AC load as its output currents, and designed to address the need set forth above.

Specifically, an alternative aspect of the present disclosure aims to provide such power converters, each of which is equipped with AC busbars for carrying the output currents, and designed such that a current sensor is easily attached to the AC busbars during fabrication thereof, resulting in improvement of the fabricability of the power converters.

According to a first exemplary aspect of the present disclosure, there is provided a power converter for power conversion between a direct current (DC) power source and an alternating current (AC) load. The power converter includes a plurality of semiconductor modules each including a semiconductor element and an encapsulation body in which the semiconductor element is encapsulated. The semiconductor element has power terminals projecting from the encapsulation body. The power converter includes a plurality of refrigerant paths through which refrigerant flows. The plurality of semiconductor modules and the plurality of refrigerant paths are stacked to constitute a stacked converter unit. The power converter includes a set of busbars each electrically connected to a corresponding at least one of the power terminals of each of the plurality of semiconductor modules. The set of busbars include a positive busbar electrically connected to a positive terminal of the DC power source; a negative busbar electrically connected to a negative terminal of the DC power source; and a plurality of AC busbars electrically connected to the AC load. The power converter includes an insulating support that surrounds at least part of the stacked converter unit, the set of busbars being fixedly mounted on the insulating support, and a terminal holder having a mount surface on which one end of each of the plurality of AC busbars is mounted as a terminal. The power converter includes a current sensor having a through-hole and configured to measure a current flowing through at least part of at least one of the plurality of AC busbars. The current sensor is attached to the terminal holder with, the at least part of the at least one of the plurality of AC busbars being fitted in the through-hole of the current sensor.

According to a second exemplary aspect of the present disclosure, there is provided a power converter for power conversion between a direct current (DC) power source and an alternating current (AC) load. The power converter includes a plurality of semiconductor modules each including a semiconductor element and an encapsulation body in which the semiconductor element is encapsulated. The semiconductor element has power terminals projecting from the encapsulation body. The power converter includes a plurality of refrigerant paths through which refrigerant flows. The plurality of semiconductor modules and the plurality of refrigerant paths are stacked to constitute a stacked converter unit. The power converter includes a set of busbars each electrically connected to a corresponding at least one of the power terminals of each of the plurality of semiconductor modules. The set of busbars includes: a positive busbar electrically connected to a positive terminal of the DC power source; a negative busbar electrically connected to a negative terminal of the DC power source; and a plurality of AC busbars electrically connected to the AC load. The power converter includes a molded-resin busbar holder designed as a separate member from the set of busbars and including an insulating support and a terminal holder, the molded-resin busbar holder being constructed by integral molding of the insulating support and the terminal holder. The insulating support surrounds at least part of the stacked converter unit. The set of busbars is fixedly mounted on the insulating support. The terminal holder has a mount surface on which one end of each of the plurality of AC busbars is mounted as a terminal. The power converter includes a current sensor having a through-hole and configured to measure a current flowing through at least part of at least one of the plurality of AC busbars. The current sensor is attached to the terminal holder with the at least part of the at least one of the plurality of AC busbars being fitted in the through-hole of the current sensor.

The above and/or other features, and/or advantages of various aspects of the present disclosure will be further appreciated in view of the following description in conjunction with the accompanying drawings. Various aspects of the present disclosure can include or exclude different features, and/or advantages where applicable. In addition, various aspects of the present disclosure can combine one or more feature of other embodiments where applicable. The descriptions of features, and/or advantages of particular embodiments should not be constructed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
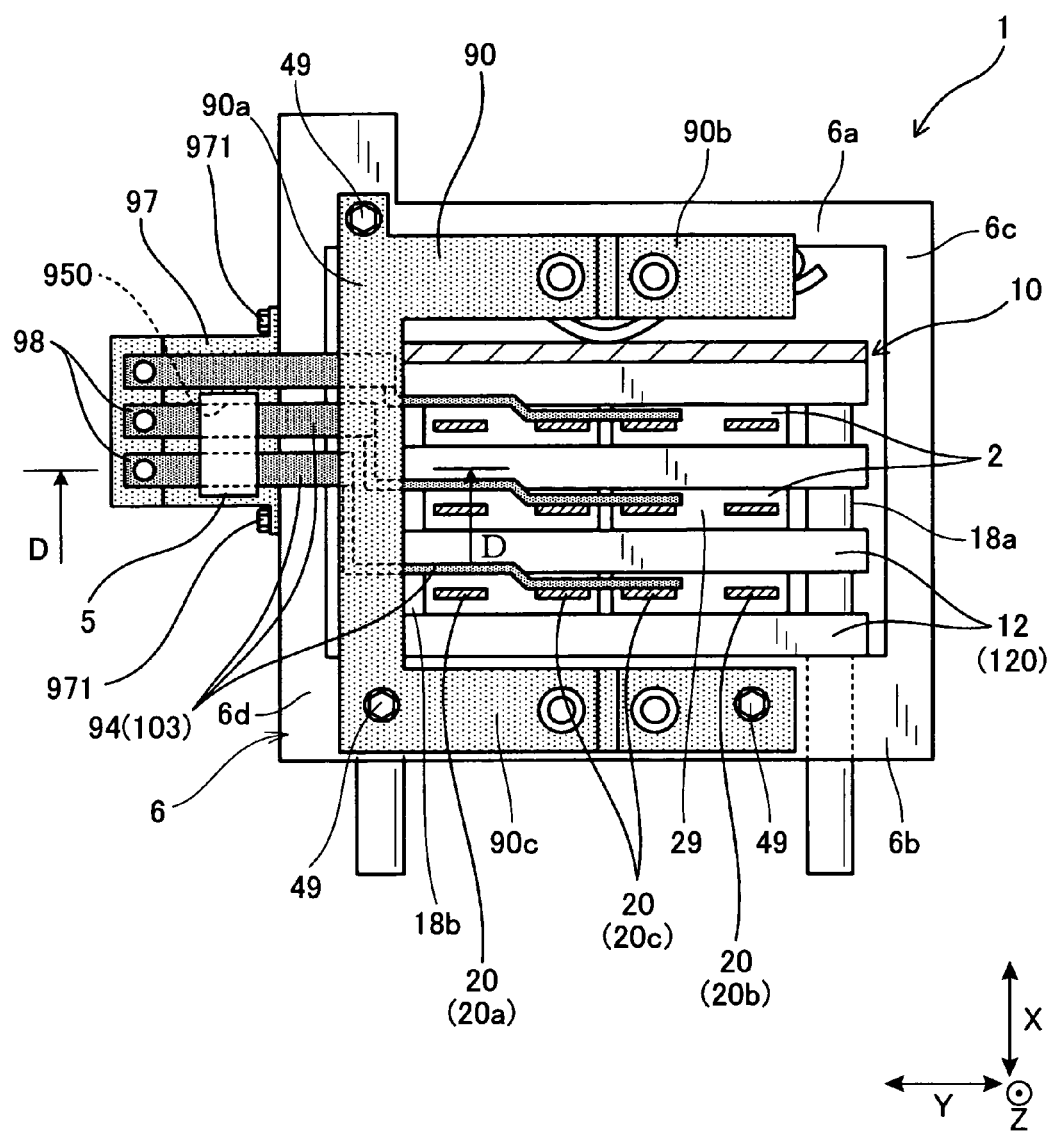
FIG. 1 is a top plan view of a power converter with positive and negative busbars removed according to a first embodiment of the present disclosure.

Embodiments of the present disclosure will be described hereinafter with reference to the accompanying drawings. In these embodiments, like parts to which like reference characters are assigned are omitted or simplified to avoid redundant description.

First Embodiment

An example of the structure of a power converter 1 according to a first embodiment of the present disclosure will be described hereinafter with reference to FIGS. 1 to 4.

Figure 2:
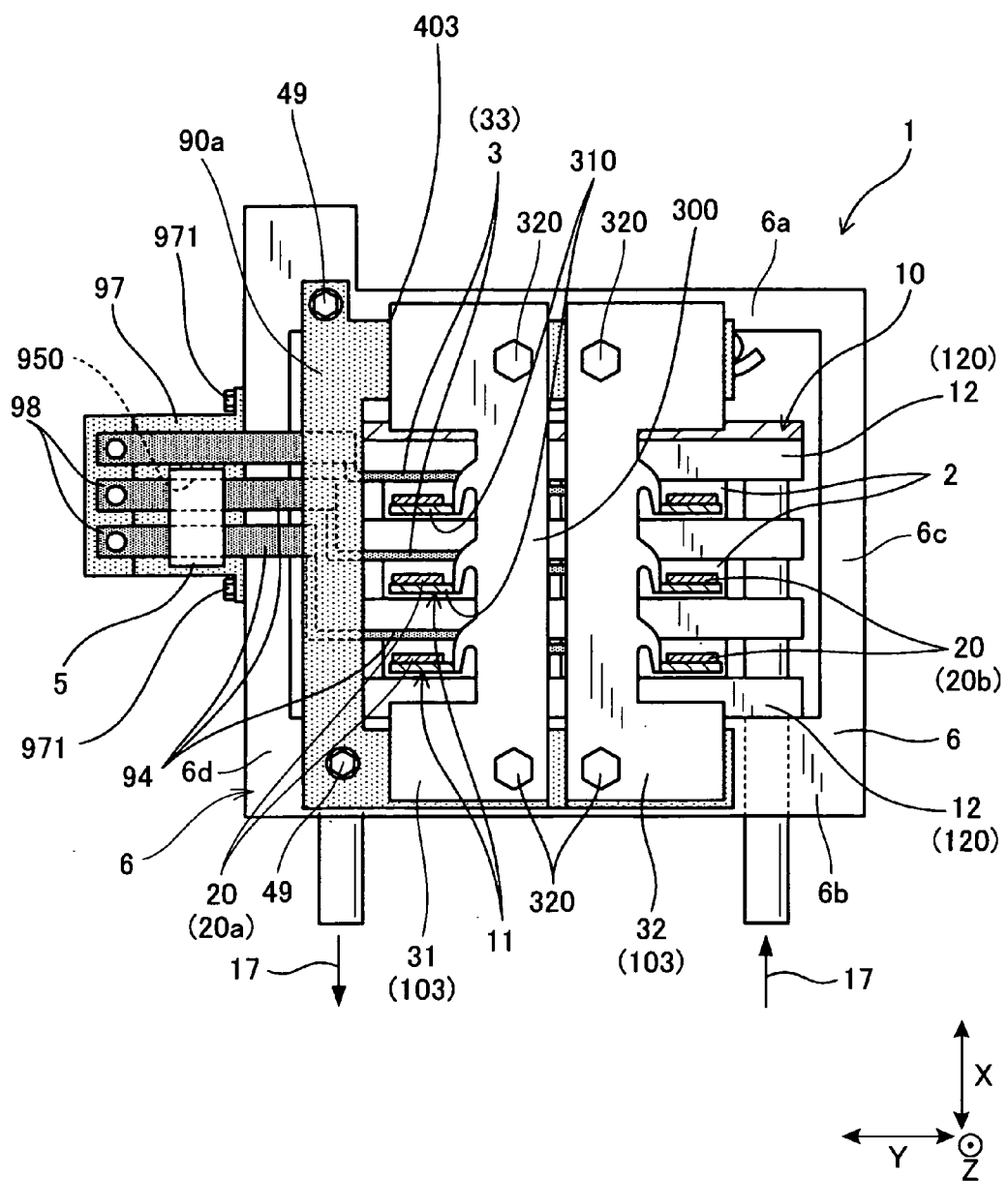
FIG. 2 is a top plan view of the power converter according to the first embodiment.

Referring to FIGS. 1 and 2, the power converter 1 is comprised of a rectangular annular frame, referred to simply as a frame, 6, a stacked converter unit 10, an insulating support 90, a set of busbars 103, a terminal holder 97, and a current sensor 5.

Referring to FIG. 1, the frame 6 is made of metal, and has a first pair of sidewalls 6a and 6b, and a second pair of sidewalls 6c and 6d. The sidewall 6b is thicker than the sidewall 6a. The frame 6 has an inner hollow chamber therein defined by the sidewalls 6a to 6d.

The stacked converter unit 10 consists of a plurality of semiconductor modules 2 and a plurality of refrigerant flow paths, i.e. refrigerant flow channels, 12 alternately stacked such that both refrigerant flow paths are located at the top and bottom of the stacked converter unit 10. The plurality of refrigerant flow paths 12 are operative to cool the plurality of semiconductor modules 2.

Figure 3:
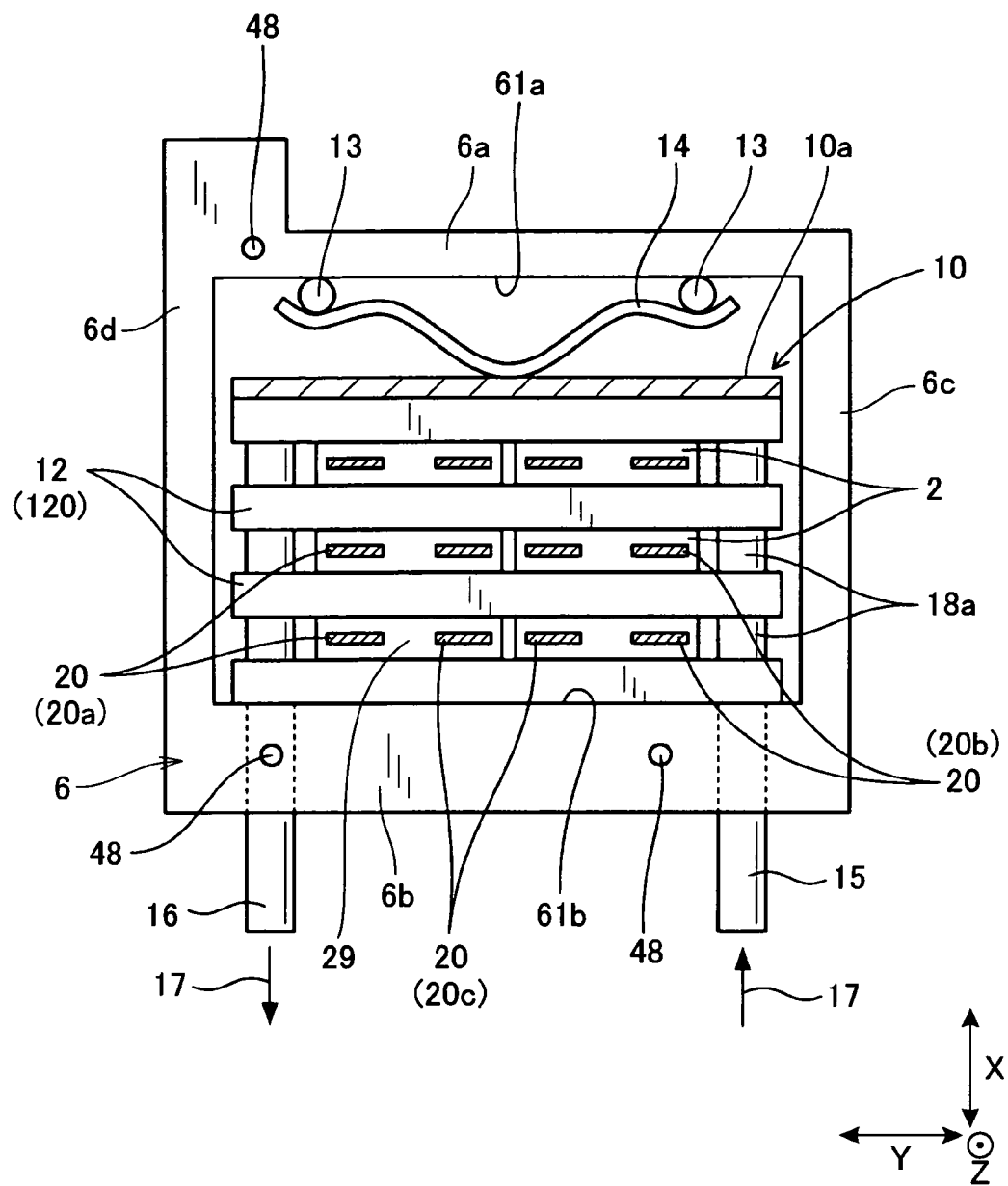
FIG. 3 is a top plan view of a stacked converter unit and a rectangular annular frame of the power converter illustrated in FIG. 1.

Specifically, referring to FIGS. 1 and 3, the stacked converter unit 10 consists of a plurality of cooling pipes 120 that define the plurality of refrigerant flow paths 12 therein. The stacked converter unit 10 consists of a plurality of first connection pipes 18a and a plurality of second connection pipes 18b. Each of the plurality of first connection pipes 18a communicably connects between first ends of corresponding adjacent cooling pipes 120. Similarly, each of the plurality of second connection pipes 18b communicably connects between second ends of corresponding adjacent cooling pipes 120 opposite to the first ends thereof.

The stacked converter unit 10 is disposed in the inner hollow space of the frame 6 such that the stack direction is parallel to the pair of sidewalls 6c and 6d and the longitudinal direction, i.e. the flow direction, of each refrigerant flow path 12 is parallel to the pair of sidewalls 6a and 6b. The stack direction will also be referred to as an X direction, and the longitudinal direction of each refrigerant flow path 12 will also be referred to as a Y direction orthogonal to the X direction (see FIG. 1).

Each of the semiconductor modules 2 is comprised of a rectangular-parallelepiped encapsulation body 29 in which a semiconductor element is encapsulated. Each of the semiconductor modules 2 is configured such that its power terminals 20 project from one top face of the encapsulated body 29 in a Z direction orthogonal to the X direction and the Y direction, so that the projecting ends of the power terminals 20 are located above the inner hollow space of the frame 6 in the Z direction. A plurality of control terminals 21 (see FIG. 5) project from a bottom face of the encapsulated body 29 of each of the semiconductor modules 2 opposite to the top face thereof in the Z direction.

Referring to FIG. 1, each of the semiconductor modules 2 is configured such that a pair of encapsulated bodies 29 are combined to each other, but can be separated from each other.

The power terminals 20 of each of the semiconductor modules 2 include a positive terminal 20a, a negative terminal 20b, and a pair of AC terminals 20c.

The insulating support 90 has a substantially U-shape, and consists of a base portion 90a and a pair of leg portions 90b and 90c continuously extending therefrom. The insulating support 90 is mounted on a top end face of the frame 6 to surround the stacked converter unit 10. Specifically, each end of the base portion 90a is located on the top end face of one end of a corresponding one of the sidewalls 6a and 6b to be close to the sidewall 6d of the frame 6. Each of the leg portions 90b and 90c is located on the top end face of a corresponding one of the sidewalls 6a and 6b. For example, as illustrated in FIG. 3, a female thread 48 is formed in the top end face of the one end of each of the sidewalls 6a and 6b, and a female thread 48 is formed in the top end face of the other end of the sidewall 6b. The insulating mount 90 is fixedly mounted on the top end face of the frame 6 by screwing bolts 49, aligned with the female threads 48, into the female threads 48.

The set of busbars 103 is comprised of a number of AC busbars 94, a positive busbar 31, and a negative busbar 32. In this embodiment, the number of AC busbars 94 are three previously determined depending on the number of output currents required for an AC load for the power converter 1.

The AC busbars 94 are disposed above the top end face of the sidewall 6d and the inner hollow space of the frame 6 to be lined in the X direction such that their middle portions are enclosed in the base portion 90a of the insulating mount 90. First ends of the AC busbars 94, which extend from the base portion 90a to the sidewall 6d, project outwardly from the sidewall 6d in the Y direction. A second end of each of the AC busbars 94 opposite to the corresponding first end, which extends from the base portion 90a toward the sidewall 6c, is joined to the pair of AC terminals 20c of a corresponding one of the plurality of semiconductor modules 2 by welding or the like.

Referring to FIG. 2, the positive busbar 31 is comprised of a base portion 300 having a substantially U shape, and comb projections 310 from an inner bottom side of the base portion 300. The positive busbar 31 is threadedly mounted on the leg portions 90b and 90c of the insulating support 90 by bolts 320 such that the comb projections 310 are welded to the positive terminals 20a of the respective semiconductor modules 2.

Similarly, the negative busbar 32 is comprised of a base portion 300 having a substantially U shape, and comb projections 310 from an inner bottom side of the base portion 300. The negative busbar 32 is threadedly mounted on the leg portions 90b and 90c of the insulating support 90 by bolts 320 such that the comb projections 310 are welded to the negative terminals 20b of the respective semiconductor modules 2. The positive busbar 31 and the negative busbar 32 are electrically connected to respective positive and negative terminals 71 and 72 of a DC power source 70 (see FIG. 5 described later).

The terminal holder 97 is made of resin, and has a substantially rectangular parallelepiped shape. The terminal holder 97 is threadedly mounted at its one side on the outer face of the sidewall 6d by bolts 971 while the top side of the terminal holder 97 is higher in the Z direction than the top end face of the sidewall 6d. Tip ends of the projecting portions of the AC busbars 94 from the sidewall 6d serve as terminals 98 of the AC busbars 94, and the terminals 98 of the AC busbars 94 are mounted on a corresponding one end of the top side of the terminal holder 97; the one end of the top side of the terminal holder 97 is higher than the remaining portion of the top side thereof. The terminals of the AC busbars 94 are electrically connected to the AC load for the power converter 1.

Figure 4:
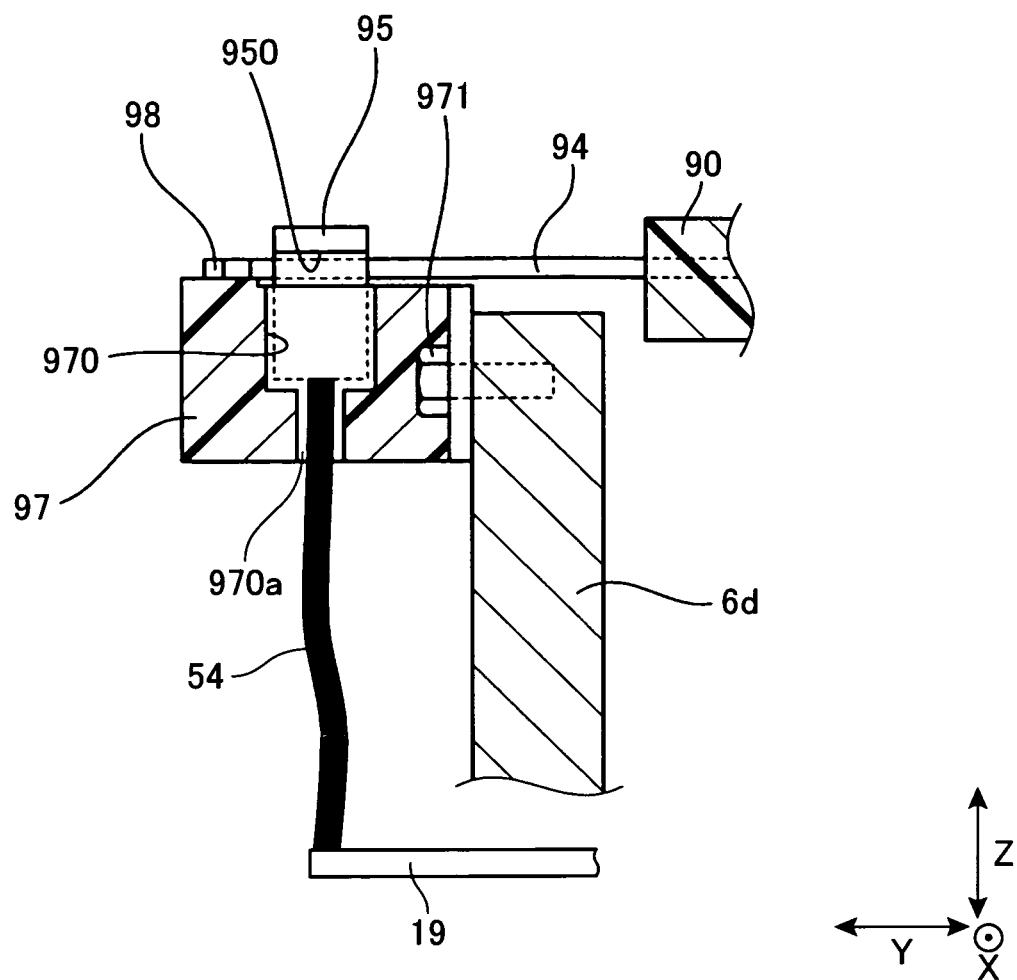
FIG. 4 is a schematic cross sectional view taken on line D-D of FIG. 1.

The terminal holder 97 has a rectangular-parallelepiped groove 970 formed in the remaining portion of the top side thereof (see FIG. 4). The current sensor 5 is detachably installed in the groove 970 to be fixed thereto. The terminal holder 97 is also formed therein with a path 970a communicating with the groove 970 and the bottom side thereof; a cable 54 as a set of wires is drawn out from the current sensor 5 via the path 970a to be electrically connected to a control board 19 to which the plurality of control terminals 21 of the semiconductor modules 2 are electrically connected.

As the current sensor 5, a Hall effect current sensor is used. The Hall effect current sensor is operative to produce a voltage difference, i.e. the hall voltage, across its electrical conductor, transverse to a current in the conductor and a magnetic field perpendicular to the current.

Specifically, the current sensor 5 has a rectangular-parallelepiped shape allowed to be installed in the groove 970 of the terminal holder 97.

The current sensor 5 has two through-holes 50 therethrough; the through-holes 50 are aligned with two of the three AC busbars 94, respectively, such that the two AC busbars 94 are fitted in the respective through-holes 50. With the structure, the current sensor 5 is operative to measure values of the output current being supplied from the power converter 1 to the AC load via each of the two AC busbars 94, and output, to the control board 19, the measured values of the output currents to the AC load. Specifically, a control circuit formed on the control board 19 is operative to control the switching operations of the semiconductor modules 2 using the measured values of the output currents to the AC load to thereby convert a DC voltage applied across the positive and negative terminals 20a and 20b into a desired AC voltage, and supply, to the AC load, alternating currents as the output currents.

In addition, referring to FIG. 3, the stacked converter unit 10 is located to abut on the inner face 61b of the sidewall 6b to provide a space between the top side 10a of the stacked converter unit 10 and the inner face 61a of the sidewall 6a.

The power converter 1 is provided with a pair of poles 13 located in the space to abut on the inner face 61a of each of the Y-directional ends of the sidewall 6a. The power converter 1 is also provided with a leaf spring 14 disposed between the top side 10a of the stacked converter unit 10 and each pole 13; the leaf spring 14 urges the stacked converter unit 10 to the inner face 61b of the sidewall 6b to thereby fix the stacked converter unit 10 to the frame 6.

In addition, the power converter 1 is provided with a refrigerant inlet pipe 15 communicably coupled to the first end of the bottom cooling pipe 12a and project outwardly through the sidewall 6b. The power converter 1 is also provided with a refrigerant exhaust pipe 16 communicably coupled to the second end of the bottom cooling pipe 12a and project outwardly through the sidewall 6b. When refrigerant 17 is introduced into the bottom cooling pipe 120a via the refrigerant inlet pipe 15, the refrigerant 17 flows through all the cooling pipes 120 via the first and second collection pipes 18a and 18b, and is exhausted from the refrigerant exhaust pipe 16. This cools the semiconductor modules 2 of the stacked converter unit 10.

Figure 5:
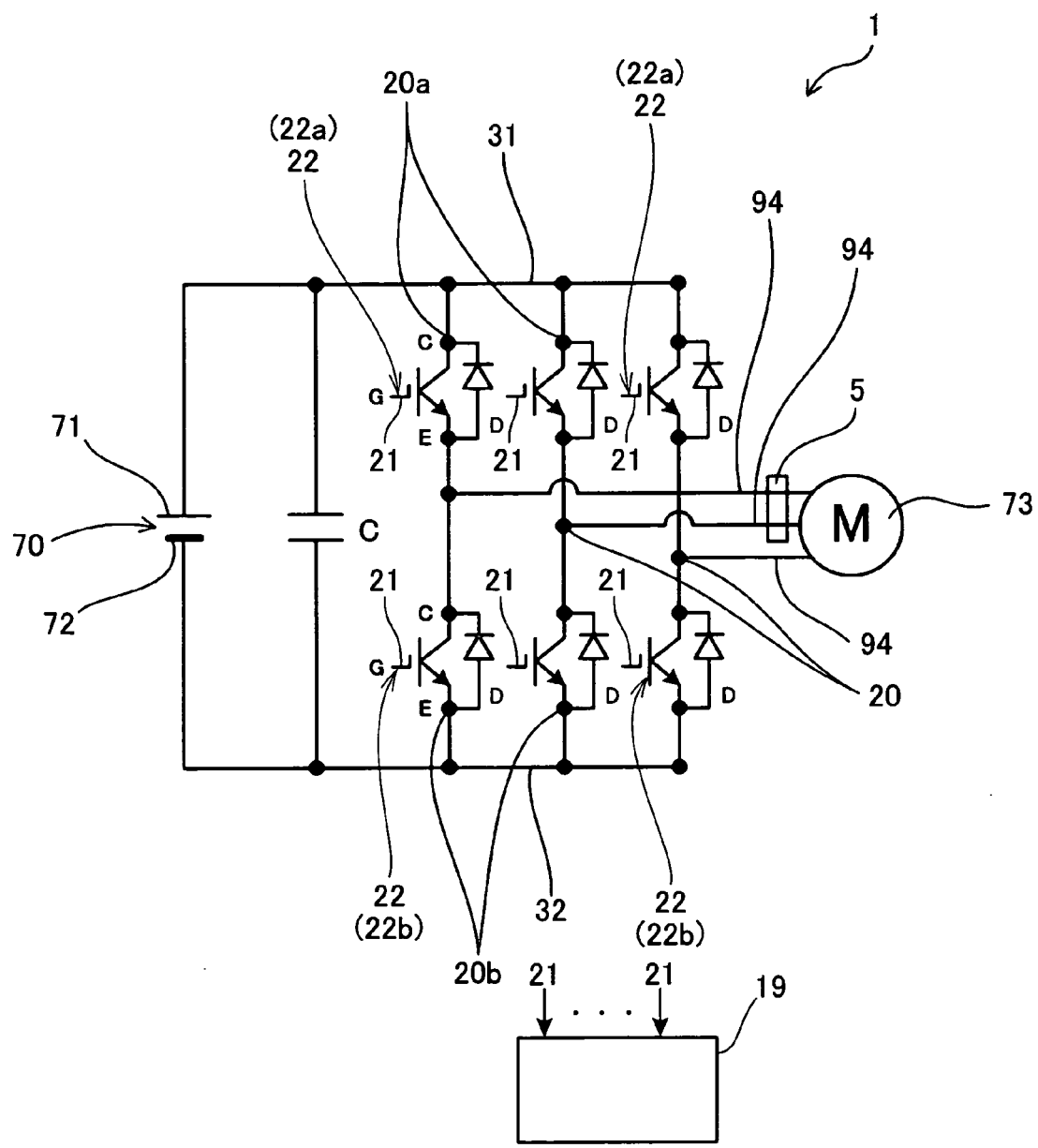
FIG. 5 is a circuit diagram of the power converter according to the first embodiment.

FIG. 5 schematically illustrates an example of the circuit diagram of the power converter 1 according to this embodiment. Referring to FIG. 5, in this embodiment, a three-phase AC motor 73 is used as the AC load for the power converter 1. For this reason, the number of the semiconductor modules 2 in the stacked converter unit 10 is set to be three corresponding to the number of phases of the AC motor 73, and each of the three semiconductor modules 2 includes a pair of high-side and low-side IGBT elements 22a and 22b, i.e. a pair of upper-arm and lower-arm IGBT elements 22a and 22b.

Specifically, the collector of the high-side IGBT element 22a of each of the semiconductor modules 2 is electrically connected to the positive busbar 31 electrically connected to the positive terminal 71 of the DC power source 70. The gate of the high-side IGBT element 22a of each of the semiconductor modules 2 is electrically connected to the control board 19.

Similarly, the emitter of the low-side IGBT element 22b of each of the semiconductor modules 2 is electrically connected to the negative busbar 32 electrically connected to the negative terminal 72 of the DC power source 70. The gate of the low-side IGBT element 22b of each of the semiconductor modules 2 is electrically connected to the control board 19.

The emitter of the high-side IGBT element 22a of each of the semiconductor modules 2 is electrically connected to the collector of the low-side IGBT element 22b of a corresponding one of the semiconductor modules 2, and the connection point of each pair of the high-side and low-side IGBT elements 22a and 22b is electrically connected to a corresponding one of the three-phase stator windings of the three-phase AC motor 7. In FIG. 5, reference character C represents, for example, a smoothing capacitor for smoothing a DC voltage outputted from the DC power source 70. Reference characters D represent flywheel diodes electrically connected in antiparallel to the IGBTs 22, respectively.

As described above, the control circuit of the power converter 1 converts a DC voltage supplied from the DC power source 71 and applied across the positive and negative terminals 20a and 20b into a desired AC voltage, and supplies, to the AC motor 73, alternating currents as the output currents.

Next, how to fabricate the power converter 1 according to this embodiment will be described hereinafter.

First, the stacked converter unit 10, the frame 6, the insulating support 90, and the terminal holder 97 are prepared. Next, the insulating support 90 is fixedly mounted on the top end face of the frame 6 using the bolts 49, and the second ends of the AC busbars 94 are joined to the AC terminals 20c of the respective semiconductor modules 2 by welding or the like.

Thereafter, place the terminal holder 97 close to the frame 6 in the direction illustrated in FIG. 1 with the current sensor 5 fitted in the groove 970, so that the terminals 98 of the AC busbars 94 are inserted into the corresponding through-holes 50 of the current sensor 5. Then, the terminal holder 97 is fixed to the outer face of the sidewall 6d by the bolts 971, resulting in completion of fabrication of the power converter 1.

Next, technical effects achieved by the structure of the power converter 1 according to this embodiment will be described hereinafter.

The power converter 1 is configured such that the groove 970 is formed in the top side of the terminal holder 97 for holding the terminals 98 of the AC busbars 94. This configuration allows the current sensor 5 to be easily installed in the groove 970 with two of the AC busbars 94 being fitted in the through-holes 50 of the current sensor 5 during fabrication of the power converter 1. This makes it possible to improve the fabricability of the power converter 1.

In addition, with the structure of the power converter 1, it is possible to eliminate any separate member for attaching a current sensor to the AC busbars 94, thus improving the space-saving feature of the power converter 1.

Moreover, the current sensor 5 is designed as a separate member from the insulating member 90 and the terminal holder 97, and the current sensor 5 is detachably installed in the groove 970 formed in the terminal holder 97. This would enable the current sensor 5 to be easily replaced with a new one in the event of failure in the current sensor 5.

Second Embodiment

A power converter 1A according to a second embodiment of the present disclosure will be described hereinafter with reference to FIGS. 6 to 13.

The structure and/or functions of the power converter 1A according to the second embodiment are different from the power converter 1 by the following points. So, the different points will be mainly described hereinafter.

Figure 6:
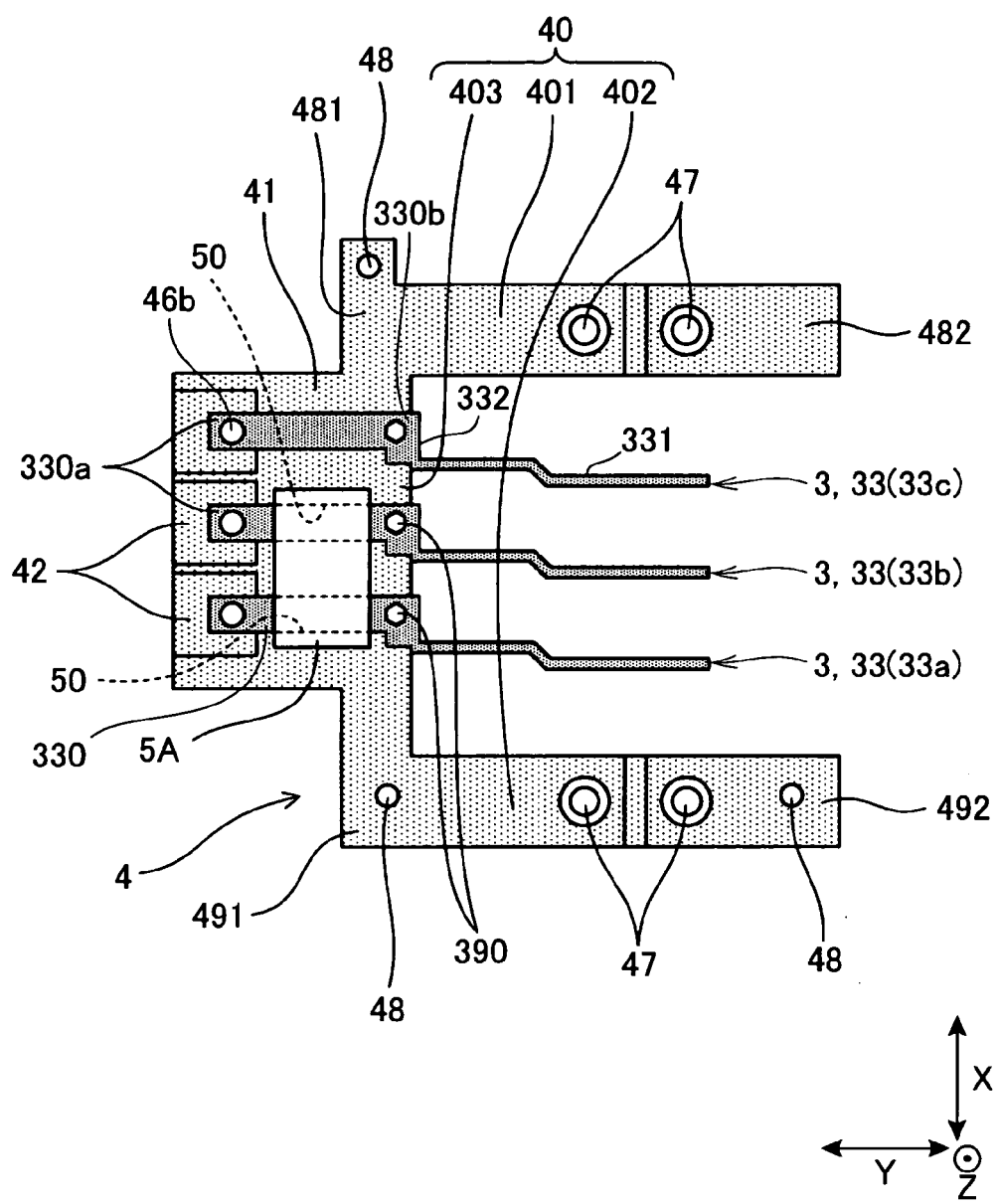
FIG. 6 is a top plan view of a molded-resin busbar holder and the set of busbars of a power converter according to a second embodiment of the present disclosure.
Figure 7:
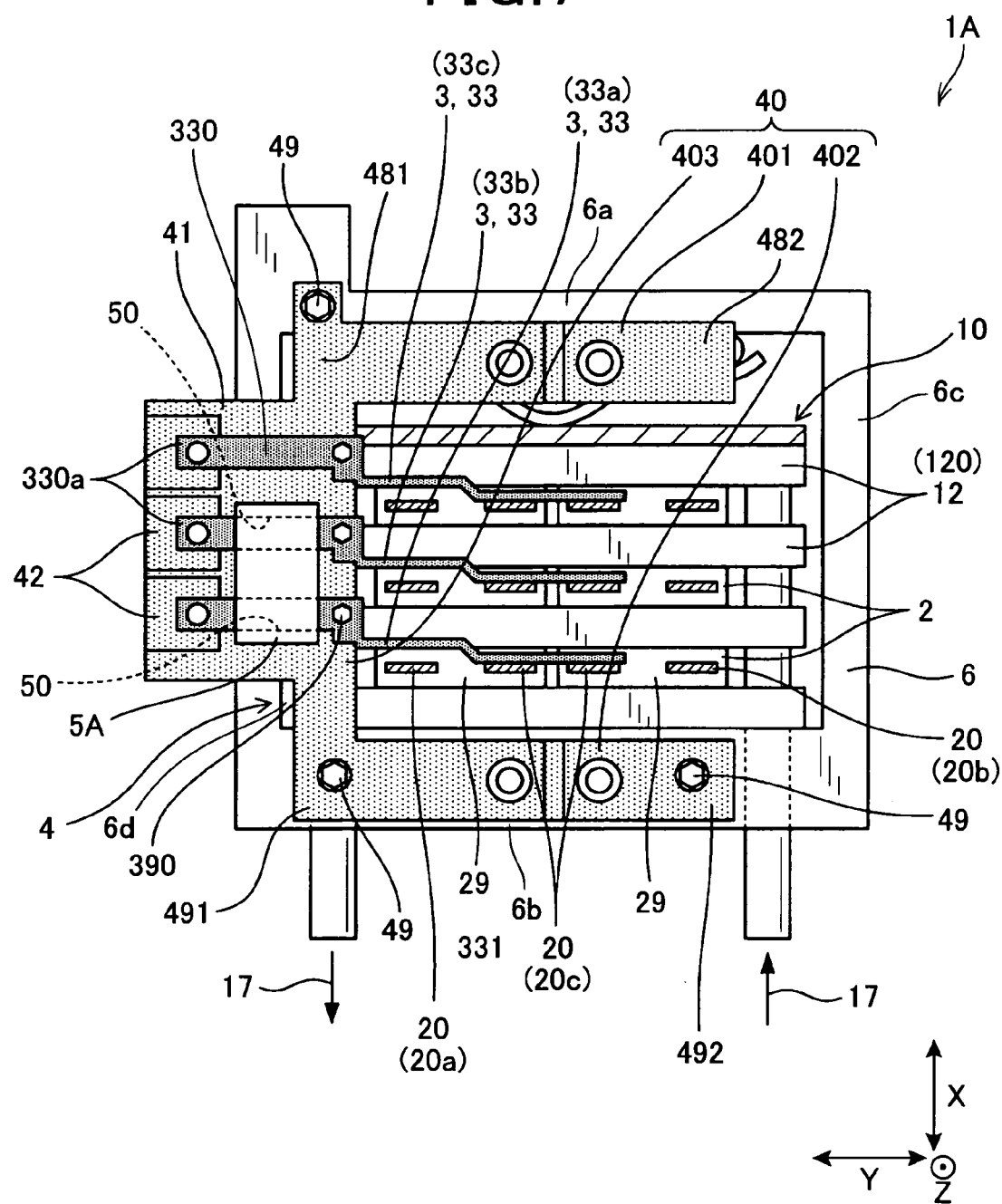
FIG. 7 is a top plan view of the power converter according to the second embodiment with positive and negative busbars removed.
Figure 8:
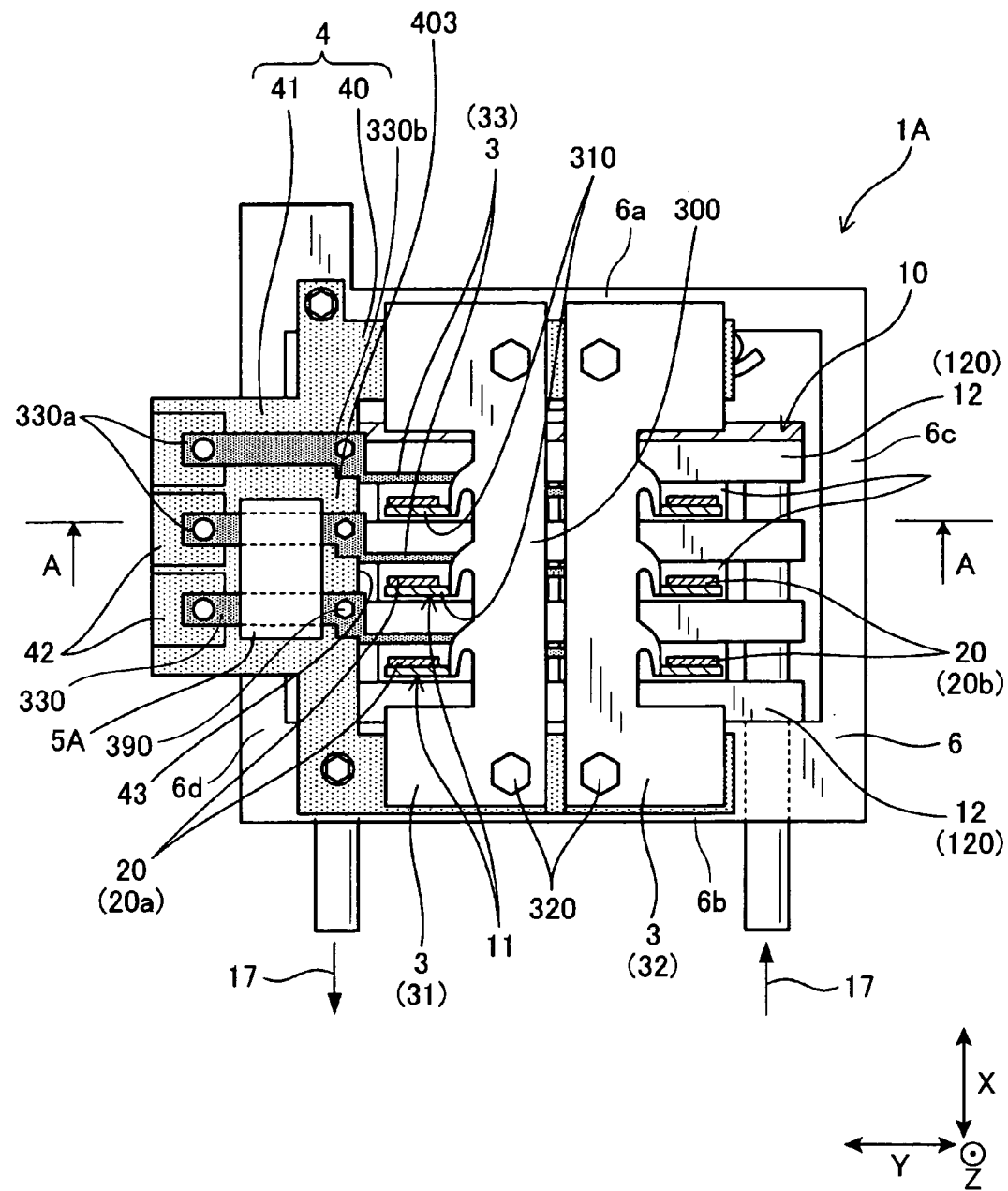
FIG. 8 is a top plan view of the power converter according to the second embodiment.

Referring to FIGS. 6 to 8, the power converter 1A is comprised of a set of busbars 3, a molded-resin buster holder 4, and a current sensor 5A; the molded-resin busbar holder 4 is constructed by integral molding of an insulating support 40 and a terminal holder 41.

The insulating support 40 has a substantially U-shape, and consists of a base portion 403 and a pair of leg portions 401 and 402 continuously extending therefrom. The insulating support 40 is mounted on a top end face of the frame 6 to surround the stacked converter unit 10. In other words, the stacked converter unit 10 is interposed between the leg portions 401 and 402 in the X direction.

Each end of the base portion 403 is located on the top end face of one end of a corresponding one of the sidewalls 6a and 6b to be close to the sidewall 6d of the frame 6. Each of the leg portions 401 and 402 is located on the top end face of a corresponding one of the sidewalls 6a and 6b. That is, the base portion 403 continuously connects one end 481 of the leg portion 401 and one end 491 of the leg portion 402. There are no resin connectors between the other end 482 of the leg portion 401 and the other end 492 of the leg portion 402. For example, as illustrated in FIG. 3, a female thread 48 is formed in the top end face of the one end of each of the sidewalls 6a and 6b, and a female thread 48 is formed in the top end face of the other end of the sidewall 6b. The insulating support 40 is fixedly mounted on the top end face of the frame 6 by screwing bolts 49, aligned with the female threads 48, into the female threads 48.

The terminal holder 41 continuously extends from the base portion 403 of the insulating support 40 in a direction opposite to the extending direction of the leg portions 401 and 402 outwardly from the sidewall 6d.

The set of busbars 3 is designed as a separate member from the molded-resin busbar holder 4. That is, the set of busbars 3 are unenclosed in the molded-resin busbar holder 4.

Specifically, the set of busbars 3 consists of a number of AC busbars 33, a positive busbar 31, and a negative busbar 32. In this embodiment, the number of AC busbars 33 is three previously determined depending on the number of output currents required for an AC load for the power converter 1A.

Figure 10:
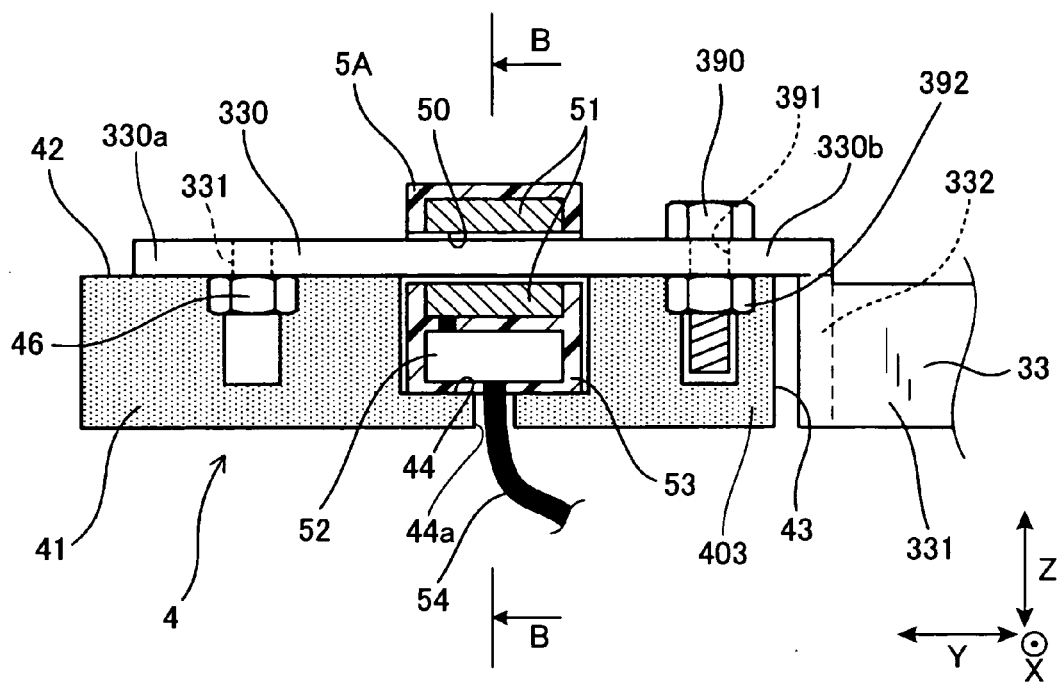
FIG. 10 is an enlarged view of a part of the molded-resin busbar holder on which AC busbars illustrated in FIG. 6 are mounted.

Referring to FIGS. 6 and 10, each of the AC busbars 33 (33a, 33b, and 33c) is comprised of a terminal portion 330, a lead portion 331, and a joint portion 332; the lead portion 331 is narrower in width than the terminal portion 330.

Each of the terminal portions 330 of the AC busbars 33 is fixedly mounted on the base portion 403 and the terminal holder 41 while extending thereon in the Y direction. The terminal portions 330 of the AC busbars 33 are also aligned in the X direction.

The lead portion 331 of each of the AC busbar 33 is located to be lower in the Z direction than the terminal portion 330 thereof, and extends from the base portion 403 toward the sidewall 6c, and is joined to the pair of AC terminals 20c of a corresponding one of the plurality of semiconductor modules 2 by welding or the like.

The joint portion 332 of each of the AC busbar 33 extends in the Z direction and joins the terminal portion 330 and the lead portion 331.

Referring to FIG. 8, the positive busbar 31 is comprised of a base portion 300 having a substantially U shape, and comb projections 310 from an inner bottom side of the base portion 300. The positive busbar 31 is threadedly mounted on the leg portions 401 and 402 of the insulating support 40 by bolts 320 and nuts 47 inserted in leg portions 401 and 402, and the comb projections 310 are welded to the positive terminals 20a of the respective semiconductor modules 2. The welded portions between the positive busbars 31 and the positive terminals 20a of the respective semiconductor modules 2 are illustrated in FIG. 8 by reference numerals 11.

Similarly, the negative busbar 32 is comprised of a base portion 300 having a substantially U shape, and comb projections 310 from an inner bottom side of the base portion 300. The negative busbar 32 is threadedly mounted on the leg portions 401 and 402 of the insulating support 40 by bolts 320 and nuts 47 inserted in the leg portions 401 and 402, and the comb projections 310 are welded to the negative terminals 20b of the respective semiconductor modules 2. The positive busbar 31 and the negative busbar 32 are electrically connected to respective positive and negative terminals 71 and 72 of a DC power source 70 (see FIG. 12 described later).

The base portion 403 of the insulating support 40 has a side face 43 located opposite to the joint portion 332 of each of the AC busbars 33 and close to the welded portions 11 between the positive busbars 31 and the positive terminals 20a of the respective semiconductor modules 2.

Referring to FIG. 8, the positive terminal 20a of each semiconductor module 2 is located to be closer to the sidewall 6b than the terminal portion 330 of a corresponding AC busbar 33 is. Thus, each of the AC busbars 33 is bent at the connection portion 332 such that the lead portion 331 is closer to the sidewall 6b than the terminal portion 330 is (see FIG. 7); this extends the connection portion 332 toward the sidewall 6b to cover at least part of the side face 43 of the base portion 403 of the insulating support 40 against radiant heat caused by the welding between the positive busbars 31 and the positive terminals 20a of the respective semiconductor modules 2.

The terminal holder 41 has a substantially rectangular parallelepiped shape, and has three mount portions 42 on the edge of the top side thereof in the Y direction. First ends 330a of the terminal portions 330 of the AC busbars 33, which are opposite to the lead portion side, serve as terminals of the AC busbars 33, and the terminals 330a of the AC busbars 33 are mounted on a corresponding one end of the mount portions 42 of the terminal holder 41. The terminals 330a of the AC busbars 33 are electrically connected to the AC load for the power converter 1A.

Figure 9:
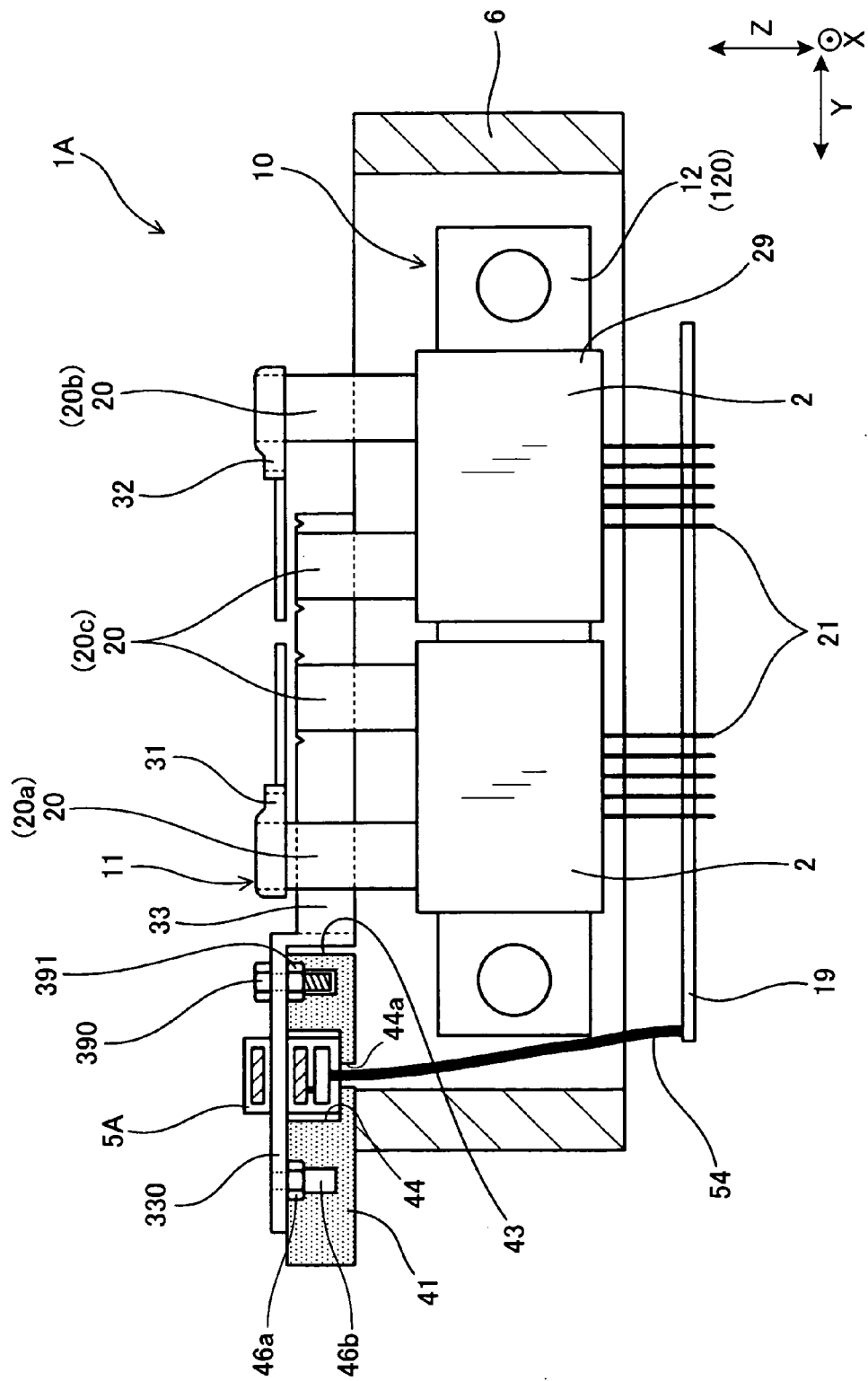
FIG. 9 is a schematic cross sectional view taken on line A-A of FIG. 8.
Figure 11:
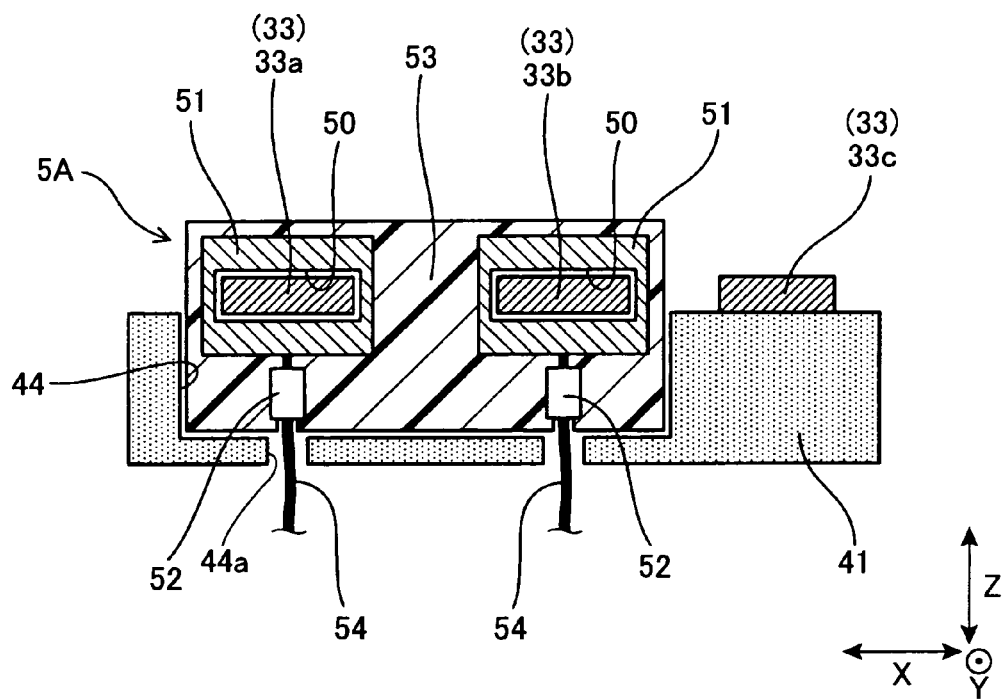
FIG. 11 is a schematic cross sectional view taken on line B-B of FIG. 10.

Referring to FIGS. 9 to 11, the terminal holder 41 has a rectangular-parallelepiped groove 44 formed in the middle portion of the top side thereof in the Y direction. The current sensor 5A is fixedly installed in the groove 44, so that the current sensor 5A is fixedly located closer to the insulating support 40 than to the mount portions 42. The terminal holder 41 is also formed therein with a pair of paths 44a communicating with the groove 44 and the bottom side thereof; a pair of cables 54, each of which is as a set of wires, are drawn out from the current sensor 5A via the respective paths 44a to be electrically connected to a control board 19 to which the plurality of control terminals 21 of the semiconductor modules 2 are electrically connected.

As the current sensor 5A, a Hall effect current sensor is used in the same measure as the first embodiment. Specifically, the current sensor 5A has a rectangular-parallelepiped resin package 53 allowed to be installed in the groove 44 of the terminal holder 41.

The current sensor 5A is comprised of two hall elements 51 and two circuit boards 52 electrically connected thereto, which are enclosed in the resin package 53. The hall elements 51 have respective through-holes 50 therethrough; the through-holes 50 are aligned with two (33a and 33b) of the three AC busbars 33, respectively, such that the terminal portions 330 of the two AC busbars 33a and 33b are fitted in the respective through-holes 50. The cables 54 are electrically connected between the circuit boards 52 of the current sensor 5A and the control board 19.

With the structure, the current sensor 5A is operative to measure values of the output current being supplied from the power converter 1A to the AC load via each of the two AC busbars 33a and 33b, and output, to the control board 19, the measured values of the output currents to the AC load. Specifically, a control circuit formed on the control board 19 is operative to control the switching operations of the semiconductor modules 2 using the measured values of the output currents to the AC load to thereby convert a DC voltage applied across the positive and negative terminals 20a and 20b into a desired AC voltage, and supply, to the AC load, alternating currents as the output currents.

Referring to FIG. 10, second ends 330b of the terminal portions 330 of the AC busbars 33, which are opposite to the first ends (terminals) 330a, are formed with bolt insert holes 391 therethrough. The second ends 330b of the terminal portions 330 are fixedly mounted on the base portion 403 of the insulating support 40 by screwing bolts 390 through the bolt insertion holes 391 into corresponding nuts 391 inserted in the terminal holder 41.

Similarly, referring to FIG. 10, the terminal holder 41 is provided with nuts 46 inserted therein. The terminals (first ends) 330a of the terminal portions 330 of the AC busbars 33 are formed with bolt insertion holes 331 therethrough. When three connection terminals (not shown) of the AC load are mounted on the terminals 330a of the terminal portions 330 with the nuts 46 aligned with the corresponding bolt insertion holes 331, bolts (not shown) are screwed through the bolt insertion holes 331 and the connection terminals of the AC load into the nuts 46, so that the connection terminals of the AC load are electrically connected to the terminals 330a of the AC busbars 330.

Figure 12:
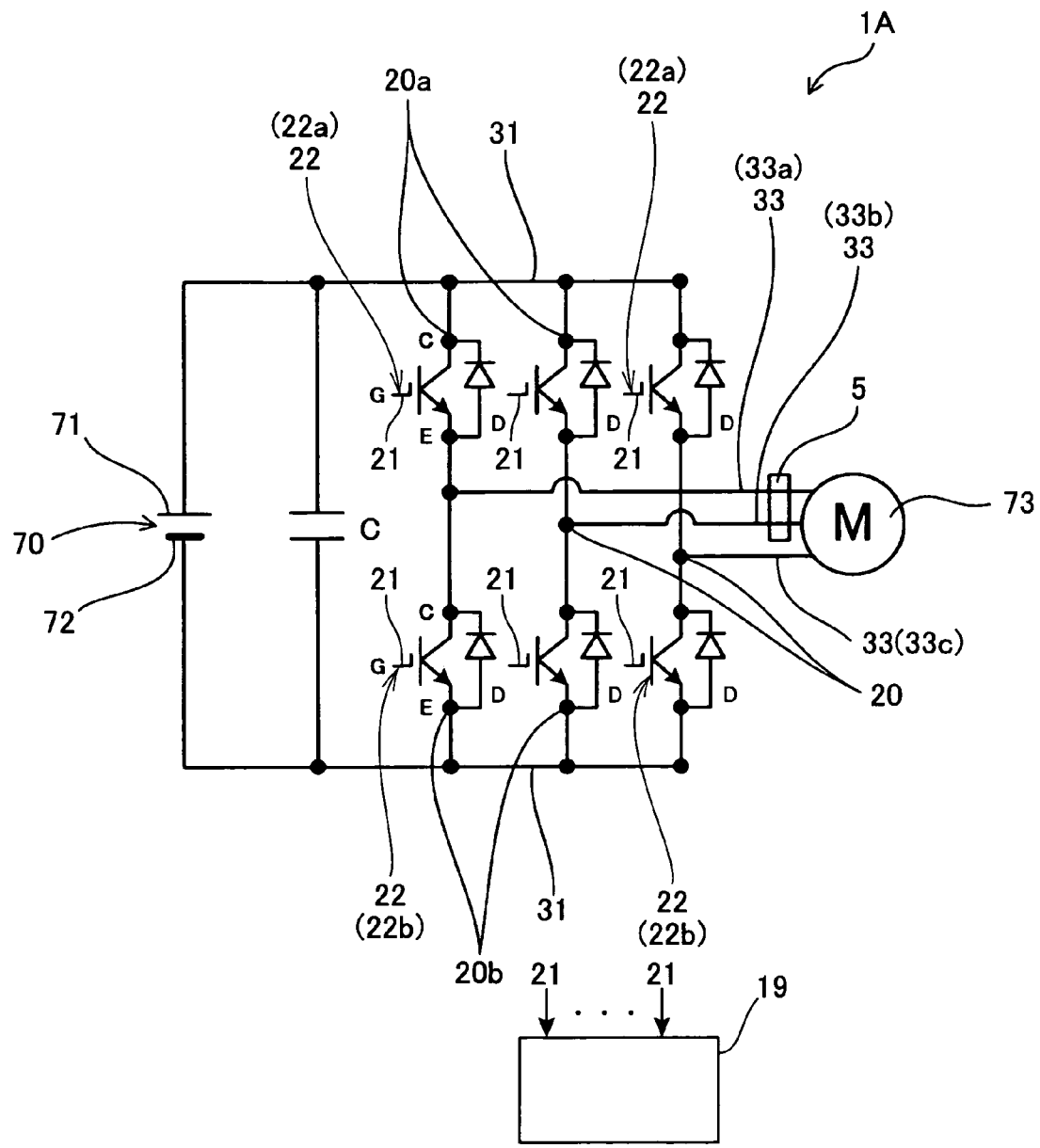
FIG. 12 is a circuit diagram of the power converter according to the second embodiment.

FIG. 12 schematically illustrates an example of the circuit diagram of the power converter 1 according to this embodiment. Referring to FIG. 5, in this embodiment, a three-phase AC motor 73 is used as the AC load for the power converter 1. For this reason, the number of the semiconductor modules 2 in the stacked converter unit 10 is set to be three corresponding to the number of phases of the AC motor 73, and each of the three semiconductor modules 2 includes a pair of high-side and low-side IGBT elements 22a and 22b, i.e. a pair of upper-arm and lower-arm IGBT elements 22a and 22b.

Specifically, the collector of the high-side IGBT element 22a of each of the semiconductor modules 2 is electrically connected to the positive bulbar 31 electrically connected to the positive terminal 71 of the DC power source 70. The gate of the high-side IGBT element 22a of each of the semiconductor modules 2 is electrically connected to the control board 19.

Similarly, the emitter of the low-side IGBT element 22b of each of the semiconductor modules 2 is electrically connected to the negative busbar 32 electrically connected to the negative terminal 72 of the DC power source 70. The gate of the low-side IGBT element 22b of each of the semiconductor modules 2 is electrically connected to the control board 19.

The emitter of the high-side IGBT element 22a of each of the semiconductor modules 2 is electrically connected to the collector of the low-side IGBT element 22b of a corresponding one of the semiconductor modules 2, and the connection point of each pair of the high-side and low-side IGBT elements 22a and 22b is electrically connected to a corresponding one of the three-phase stator windings of the three-phase AC motor 7.

As described above, the control circuit of the power converter 1A converts a DC voltage supplied from the DC power source 71 and applied across the positive and negative terminals 20a and 20b into a desired AC voltage, and supplies, to the AC motor 73, alternating currents as the output currents.

Next, technical effects achieved by the structure of the power converter 1A according to this embodiment, in addition to the technical effects achieved by the structure of the power converter 1, will be described hereinafter.

The power converter 1A is comprised of the molded-resin busbar holder 4 constructed by integral molding of the insulating support 40 and the terminal holder 41. This configuration enables the insulating support 40 and the terminal holder 41 to be formed using a single mold. This eliminates the number of molds required to manufacture the insulating support 40 and the terminal holder 41 in comparison to a case where they are separated, resulting in reduction in workload and cost required to manufacture the power converter 1A.

The power converter 1A is configured such that the AC busbars 33 and the molded-resin busbar holder 4 are respectively designed as separate members, and the two busbars 33a and 33b of the AC busbars 33 are fitted in the respective through-holes 50 of the current sensor 5A. This configuration allows the current sensor 5A to be easily attached to the AC busbars 33 during fabrication of the power converter 1A.

Specifically, separation of the AC busbars 33 from the molded-resin bulbar holder 4 allows, during fabrication of the power converter 1A, the current sensor 5A to be previously installed in the groove 44 of the terminal holder 41 of the molded-resin busbar holder 4. After installation of the current sensor 5A in the terminal holder 41 of the molded-resin busbar holder 4, the two busbars 33a and 33b of the AC busbars 33 are inserted into the respective through-holes 50 of the current sensor 5A during fabrication of the power converter 1A.

Specifically, if a part of the AC busbars 33 were enclosed in the molded-resin busbar holder 4 before attachment of the current sensor 5A to the AC busbars 33, there would be a need to attach the current sensor 5A to the AC busbars 33 of the molded-resin busbar holder 4.

However, the configuration of the power converter 1A eliminates the need to attach the current sensor 5A to the AC busbars 33 that has been already integrated with the molded-resin busbar holder 4. This makes it possible to mare easily attach the current sensor 5A to the AC busbars 33 without any interference from the terminal holder 41 of the molded-resin busbar holder 4.

Each of the AC busbars 33 is bent at the connection portion 332 such that the lead portion 331 is closer to the sidewall 6b than the terminal portion 330 is; this extends the connection portion 332 toward the sidewall 6b to protect at least part of the side face 43 of the base portion 403 of the insulating support 40 against radiant heat caused by the welding between the positive busbars 31 and the positive terminals 20a of the respective semiconductor modules 2. For this reason, it is possible to prevent the at least part of the side face 43 of the base portion 403 from being thermally damaged or being melted.

As described above, the present disclosure provides power converters 1 and 1A, each of which allows the current sensor 5 to be easily installed in the AC busbars to thereby have an improved fabricability and an improved space-saving feature.

Figure 13:
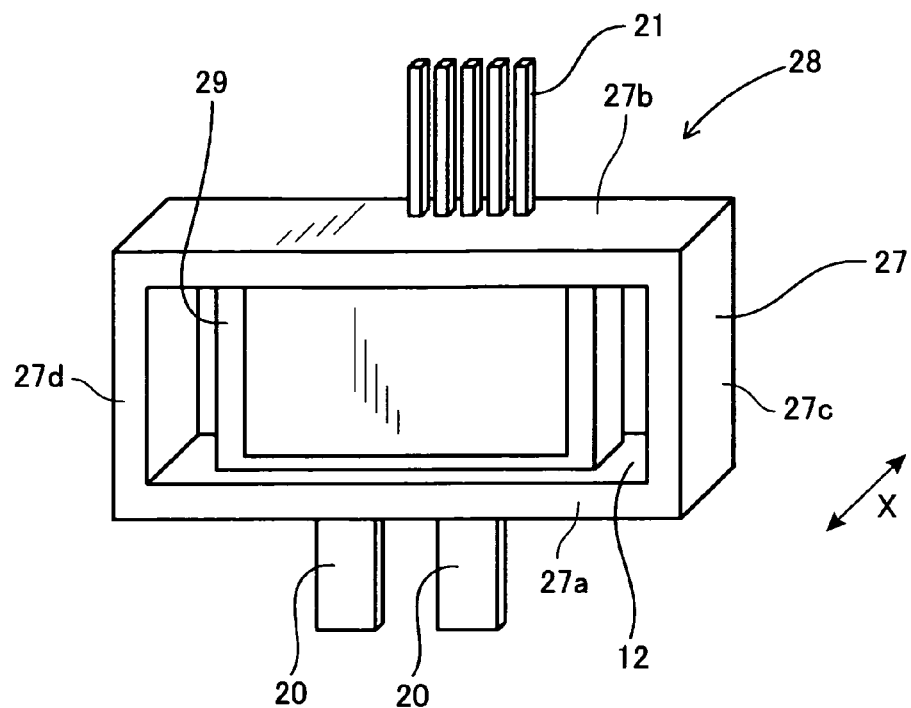
FIG. 13 is a perspective view of a semiconductor module according to a modification of the first embodiment.

In each of the first and second embodiments, the stacked converter unit 10 consists of the semiconductor modules 2 and the refrigerant flow paths 12 (the cooling pipes 120) alternately stacked, but the present disclosure is not limited thereto. Specifically, as illustrated in FIG. 13, a semiconductor module 28 is comprised of a rectangular-parallelepiped encapsulated body 29 in which a semiconductor element is encapsulated, and a rectangular annular frame 27 having a first pair of major sidewalls 27a and 27b and a second pair of minor sidewalls 27c and 27d. The longitudinal length of each of the sidewalls 27a and 27b is longer than that of each of the top and bottom faces of the encapsulated body 29. The encapsulated body 29 is mounted at its top and bottom faces on the sidewalls 27a, and 27b of the first pair while ensuring a path 12A between each side face thereof and a corresponding one of the sidewalls 27c and 27d of the second pair. The paths 12A at both sides of the encapsulated body 29 of each semiconductor module 28 serve as the refrigerant flow paths 12. Specifically, the semiconductor modules 28 are stacked in the X direction to constitute a stacked converter unit. With the stacked converter unit, the encapsulated bodies 29 are continuously stacked in the X direction, and the refrigerant flow paths 12 are also continuously stacked in the X direction.

Third Embodiment

Figure 14:
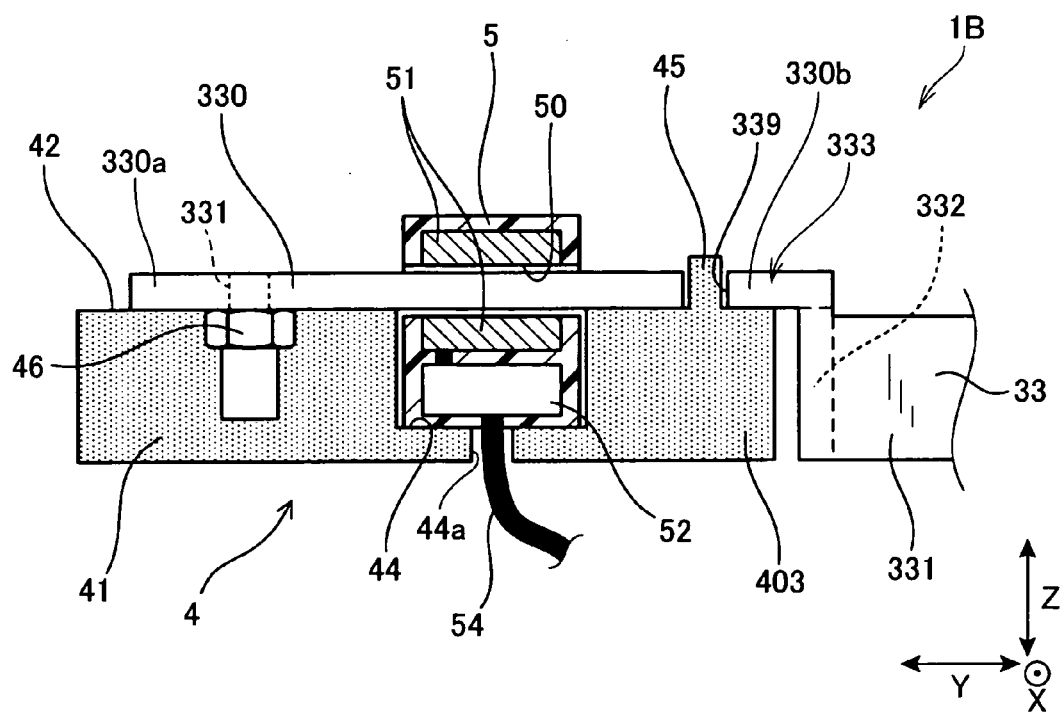
FIG. 14 is an enlarged view of a part of the molded-resin busbar holder of a power converter according to a third embodiment of the present disclosure on which AC busbars illustrated in FIG. 6 are mounted.

A power converter 1B according to a third embodiment of the present disclosure will be described hereinafter with reference to FIG. 14. The structure and/or functions of the power converter 1B according to the third embodiment are different from the power converter 1 by the following points. So, the different points will be mainly described hereinafter.

In the power converter 1B, the second ends 330b of the terminal portions 330 of the AC busbars 33 are formed with through holes 339 therethrough. The base portion 403 of the insulating support 40 is provided at its top face with projections 45. The projections 45 are aligned with the respective through holes 339. Thus, the AC busbars 330 are fixedly mounted on the insulating support 40 of the molded-resin busbar holder 4 with the projections 45 fitted in the through holes 339, respectively.

The configuration of the power converter 1B fixes the AC busbars 33 to the molded-resin busbar holder 4 without using bolts and nuts, which are for example illustrated as the bolts 390 and nuts 392. Thus, it is possible to eliminate the number of parts required to fabricate the power converter 1B as compared to those required to fabricate the power converters 1 and 1A, resulting in reduction in workload and cost required to manufacture the power converter 1B.

Fourth Embodiment

Figure 15:
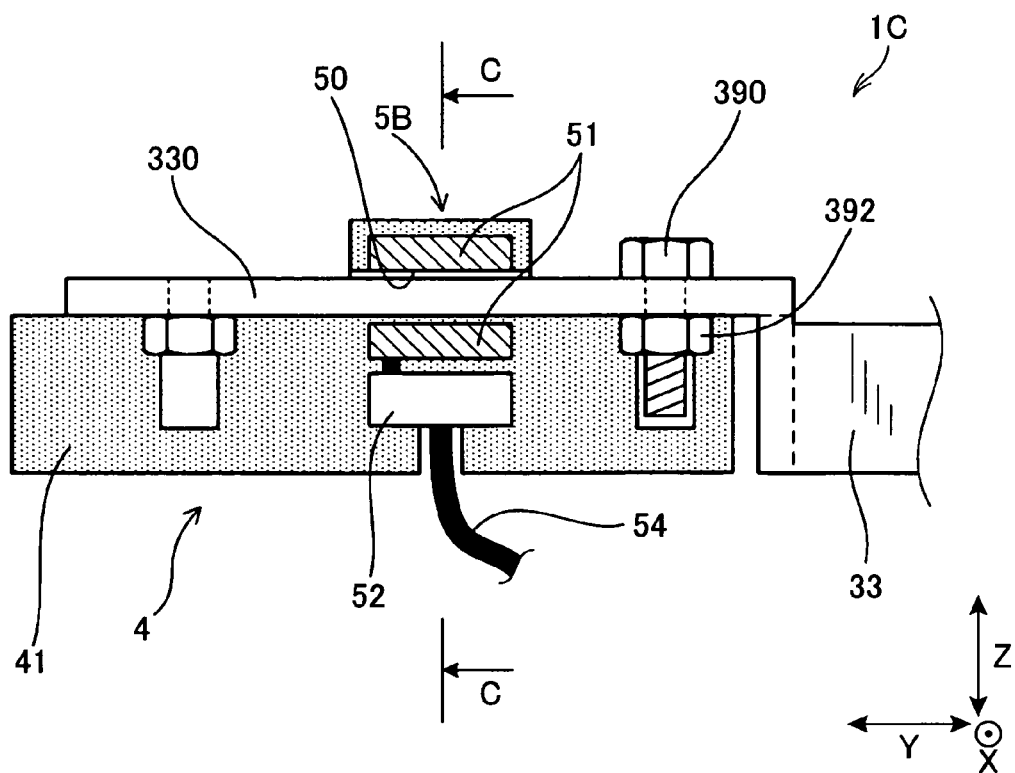
FIG. 15 is an enlarged view of a part of the molded-resin busbar holder of a power converter according to a fourth embodiment of the present disclosure on which AC busbars illustrated in FIG. 6 are mounted.
Figure 16:
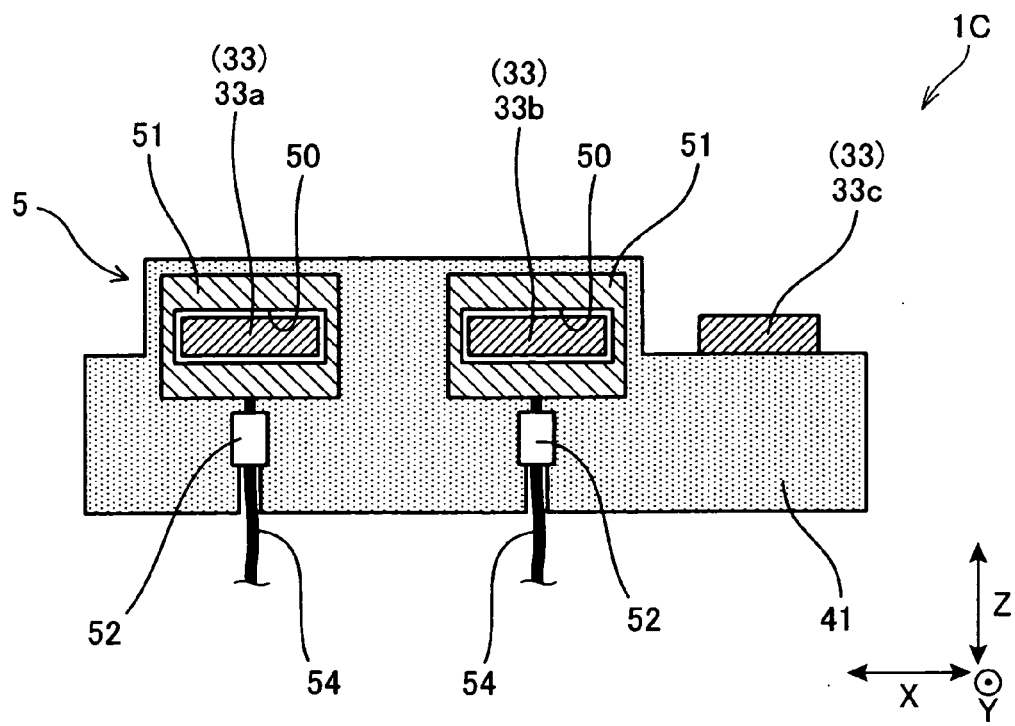
FIG. 16 is a schematic cross sectional view taken on line C-C of FIG. 15.

A power converter 1C according to a fourth embodiment of the present disclosure will be described hereinafter with reference to FIGS. 15 and 16. The structure and/or functions of the power converter 1C according to the fourth embodiment are different from the power converter 1 by the following points. So, the different points will be mainly described hereinafter.

A current sensor 5B is characterized to be enclosed in the terminal holder 41 of the molded-resin busbar holder 4. In addition, in the same structure as the current sensor 5A, the current sensor 5B is comprised of two hall elements 51 and two circuit boards 52 electrically connected thereto. The hall elements 51 have respective through-holes 50 therethrough; the through-holes 50 are aligned with two (33a and 33b) of the three AC busbars 33, respectively, such that the terminal portions 330 of the two AC busbars 33a and 33b are fitted in the respective through-holes 50. The cables 54 are electrically connected between the circuit boards 52 of the current sensor 5A and the control board 19.

The power converter 1C is configured such that the two hall elements 51 and two circuit boards 52 are enclosed in the resin portion of the resin-molded terminal holder 4, thus eliminating the resin package 53. Thus, it is possible to eliminate the number of parts required to fabricate the power converter 1C as compared to those required to fabricate the power converter 1A, resulting in reduction in workload and cost required to manufacture the power converter 1C.

While illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A power converter comprising:
a stack unit in which a plurality of semiconductor modules and a plurality of refrigerant paths through which refrigerant flows are stacked, the plurality of semiconductor modules having power terminals projecting from a body in which a semiconductor element is encapsulated;
a set of busbars electrically connected to the power terminals, the set of busbars including:
  a positive busbar electrically connected to a positive terminal of a DC power source;
  a negative busbar electrically connected to a negative terminal of the DC power source; and
  a plurality of AC busbars electrically connected to an AC load;
a frame portion surrounding the stacked unit from at least three directions when viewed from the projecting direction, the set of busbars being fixed to the frame portion;
a terminal holder having a mount surface on which terminals of the AC busbars are mounted; and
a current sensor that measures a current flowing through at least part of the AC busbars,
wherein:
the frame portion and the terminal holder are integrated to each other to constitute a resin-molded body;
the AC busbars are separate members from the resin-molded body;
the AC busbars are fixedly mounted on the resin-molded body;
the current sensor is attached to a position of the terminal holder, the position being closer to the frame portion than to the mount surface; and
at least part of the AC busbars is fitted in a through hole formed through the current sensor.

2. The power converter according to claim 1, wherein the set of busbars are welded to the power terminals, a part of a side surface of the frame portion serves as a face close to welded portions between the set of busbars and the power terminals, and the AC busbars are bent to cover at least part of the face.

3. The power converter according to claim 1, wherein the resin-molded body has a groove, and the current sensor is formed as a separate member from the resin-molded body, and installed in the groove.

4. The power converter according to claim 1, wherein the current sensor is enclosed in the molded-resin body.

5. The power converter according to claim 1, wherein the AC busbars have a busbar through hole formed therethrough in the projecting direction, and the frame portion has a projection fitted in the busbar through hole.

6. The power converter according to claim 1, wherein the terminals of the AC busbars extend in a direction substantially perpendicular to a direction of the plurality of semiconductor modules being stacked and to the projecting direction of the power terminals, and the terminal holder is arranged such that the mount surface extends in a direction substantially parallel to the extending direction of the terminals of the AC busbars.

7. The power converter according to claim 1, wherein the AC busbars are fixedly mounted on the resin-molded body with a fixture member.

8. The power converter according to claim 1, wherein the AC busbars are fixedly mounted on the resin-molded body with screwing bolts.

* * * * *